United States Patent
Feyt et al.

(10) Patent No.: US 7,934,133 B2
(45) Date of Patent: Apr. 26, 2011

(54) DETECTOR OF ABNORMAL DESTRUCTION OF MEMORY SECTORS

(75) Inventors: Nathalie Feyt, Cuges les Pins (FR); Christophe Arnoux, Corbieres (FR)

(73) Assignee: Gemalto SA, Meudon (FR)

( * ) Notice: Subject to any disclaimer, the term of this patent is extended or adjusted under 35 U.S.C. 154(b) by 354 days.

(21) Appl. No.: 12/086,252

(22) PCT Filed: Dec. 12, 2006

(86) PCT No.: PCT/EP2006/069588
§ 371 (c)(1),
(2), (4) Date: Jun. 9, 2008

(87) PCT Pub. No.: WO2007/068689
PCT Pub. Date: Jun. 21, 2007

(65) Prior Publication Data
US 2009/0254777 A1   Oct. 8, 2009

(30) Foreign Application Priority Data
Dec. 13, 2005   (FR) .................................... 05 12620

(51) Int. Cl.
*G11C 29/00* (2006.01)
*G06F 11/00* (2006.01)
(52) U.S. Cl. ............... 714/718; 714/8; 714/25; 714/47; 714/719; 714/723; 365/200; 365/201
(58) Field of Classification Search ................ 714/8, 25, 714/47, 718, 719, 723; 365/200, 201
See application file for complete search history.

(56) References Cited

U.S. PATENT DOCUMENTS

| | | | | |
|---|---|---|---|---|
| 6,529,413 | B2 * | 3/2003 | Lee et al. | 365/185.22 |
| 6,728,913 | B1 * | 4/2004 | Parker | 714/723 |
| 6,829,178 | B2 * | 12/2004 | Koyama et al. | 365/189.07 |
| 6,895,464 | B2 * | 5/2005 | Chow et al. | 711/103 |
| 6,976,197 | B2 * | 12/2005 | Faust et al. | 714/723 |
| 7,228,469 | B2 * | 6/2007 | Ito | 714/718 |
| 7,254,663 | B2 * | 8/2007 | Bartley et al. | 710/305 |
| 7,334,070 | B2 * | 2/2008 | Borkenhagen | 710/100 |
| 7,539,922 | B2 * | 5/2009 | Kim | 714/760 |
| 2004/0080988 | A1 | 4/2004 | Harari et al. | |
| 2004/0080998 | A1 | 4/2004 | Chang et al. | |
| 2005/0120266 | A1 | 6/2005 | Cernea | |
| 2006/0212677 | A1 * | 9/2006 | Fossum | 712/1 |
| 2006/0236165 | A1 * | 10/2006 | Cepulis et al. | 714/721 |
| 2007/0277065 | A1 * | 11/2007 | Sato | 714/703 |
| 2008/0082736 | A1 * | 4/2008 | Chow et al. | 711/103 |

FOREIGN PATENT DOCUMENTS

EP   1 418 502 A2   12/2004

OTHER PUBLICATIONS

PCT/ISA/210.
PCT/ISA/237.

\* cited by examiner

*Primary Examiner* — John J Tabone, Jr.
(74) *Attorney, Agent, or Firm* — Buchanan Ingersoll & Rooney PC (57) ABSTRACT

The invention relates to an integrated circuit comprising at least one microprocessor [12] linked to at least one non-volatile memory [14] that can be accessed by sectors. The integrated circuit comprises a detector [20] for discovering when a threshold number of bad sectors has been exceeded in said non-volatile memory [14].

24 Claims, 6 Drawing Sheets

DETECTOR OF ABNORMAL DESTRUCTION OF MEMORY SECTORS

BACKGROUND OF THE INVENTION

The present invention relates to the general field of protecting non-volatile memories and accessing these memories.

The main functions of a non-volatile memory are to guarantee the storage of data over time, the integrity of the stored data and the use of these data.

Non-volatile memories generally provide storage in memory sectors, one sector being the smallest entity that can be accessed for reading or writing. Generally speaking, a software program dedicated to the management of memory sectors is implemented to allocate these sectors. This is, in this instance, the case for the non-volatile memory technology known with the name of Flash technology, where such software is called FTL, an acronym standing for "Flash Translation Layer".

The use of non-volatile memory, for example such as Flash, is known in the chip card industry. In this way, memories using Flash technology are therefore built into the integrated circuit of the card and used to store code and permanent data. Such memories are generally small, several hundred kilobytes. They have a good level of security because they benefit from the security devices implemented on such circuits.

Indeed, there is a known way of protecting an integrated circuit by adding security devices to it, among others in the form of detectors that are capable of detecting anomalies in the operation of the integrated circuit, for example an frequency or operating voltage anomaly, or even that are capable of detecting anomalies in the environment of the integrated circuit, for example light detectors. The detection of such anomalies can be a sign that an attack is being carried out on the integrated circuit.

Such detectors are therefore connected to the microprocessor of the integrated circuit in order to trigger possible actions to counter, limit or prevent an attack, in particular countermeasures such as are known to those skilled in the trade.

However, it can happen that such memories are implemented in areas where few detectors have been integrated or that they are attacked in a specific manner to which the previously mentioned detectors are not sensitive. It can also happen that, in order to obtain a card with increased storage capacity, an additional non-volatile memory is implemented outside a protected area of the integrated circuit. Such an implementation is advantageous, for example, for storing proprietary programs that can then be downloaded and run from the program memory of the microprocessor.

In these cases, it is still necessary to guarantee the confidentiality and integrity of the stored data to the user, in particular if they are secure data.

AIM AND DESCRIPTION OF THE INVENTION

The aim of the present invention is therefore to provide a new type of security device that makes it possible to detect an attack on a non-volatile memory, particularly in the preceding cases.

The present invention therefore relates to an integrated circuit comprising at least one microprocessor linked to at least one non-volatile memory that can be accessed by sectors, characterised in that it comprises a detector for discovering when a threshold number of bad sectors has been exceeded in said non-volatile memory.

The invention therefore provides a new type of detector for detecting, specifically, a degradation of the memory that can signal an attack on the integrated circuit that contains the memory or on the non-volatile memory when it is an additional memory.

Sector is used to refer to a set of bytes. This term can also be used to designate a page, a block, a cell, etc.

Indeed, a disturbance of the operating parameters or operational environment of the memory produces, in general terms, a larger number of bad sectors than the normal rate of degradation normally measured by the manufacturer using statistical methods. The normal rate of degradation can generally be accessed by the user in the technical specifications of each type of memory. For example, a 128-megabyte Flash memory with a 5-year warranty physically contains more than 128 megabytes, for example 140 megabytes, since the manufacturer knows that an average rate of use over 5 years will generate 12 megabytes of bad sectors.

The invention increases the resistance of the non-volatile memory to degradations of the memory's operating parameters, for example caused by sudden changes in the power supply, and to environmental disturbances, for example bombardments of photons or particles or disturbances caused by electromagnetic radiation. Indeed, such disturbances result in premature degradation of the memory, which can be detected by the invention.

In general terms, the invention therefore makes it possible to detect attacks, of a type currently known or unknown, resulting in a degradation of the memory capacities. Notably, the invention makes it possible to detect laser shot attacks, which make it possible to force changes in the value of the registered bits but which, at the same time, can cause abnormal damage to the memory sectors. The invention conducts a physical inspection of the memory sectors with a view to detecting abnormal destructions, which signal an attack.

The detector according to the invention then makes it possible to trigger an action from among those available to those skilled in the trade, in particular it triggers resetting the component, updating the information that will then be passed up to the system or to the user, deleting all the data in the memory, interrupting the read and write access, etc.

In one embodiment of the invention, the integrated circuit containing detection means that are capable of detecting a bad sector in a non-volatile memory, it additionally includes a so-called degradation register, incremented every time the detection means detect a bad sector.

The detection means advantageously use a software program for managing the non-volatile memory.

Indeed, non-volatile memories require fine management of the memory sectors that can become bad sectors over time due to degradation phenomena. The bad sectors cannot then be read or written.

In general terms, a memory management program allocates the sectors and marks them as bad sectors when they are detected as being such. A bad sector is only detected when the user requests access to this bad sector. This program is installed in the microprocessor, which uses the non-volatile memory to store and read data. If it is a Flash memory, it is FTL, mentioned previously.

This embodiment is also particularly advantageous as it exploits a well-known function of such software, which is to list the bad sectors that can no longer be accessed for reading or writing. The invention can therefore be adapted to a number of different types of memory-management software, in particular for Flash memory.

In practice, it is possible to include the detection means in the management software itself or, indirectly, to consult a list of bad sectors maintained by the management software.

However, according to this embodiment, bad sectors are not known until a read or write request has been made on said sector. It is therefore not possible to access the number of bad sectors in real time.

In one embodiment of the invention, the detection means include means of scanning the non-volatile memory for bad sectors.

Such means of scanning the non-volatile memory allow an updated list of bad sectors to be obtained after the scan.

With a view to conserving resources, the scan can be carried out according to a memory sampling plan. For example, only one in three physically contiguous sectors is scanned.

Depending on the resources available in the application concerned, in particular power-supply time, the scan can be carried out periodically and/or triggered by a certain event, for example, the circuit receiving power or a lack of processor activity. In the latter case, the processor's "unused cycles" are thus used to update the number of bad sectors.

According to a particular characteristic of the invention, the degradation register is implemented on a memory other than the non-volatile memory which is controlled by the detector.

In particular, this makes it possible to implement the means of the invention on a memory which reacts differently to the same disturbances.

According to another particular characteristic of the invention, an integrity check is carried out on at least the degradation register.

According to an advantageous characteristic, the detection means are such that the operations required to discover when the threshold number has been exceeded are performed a number of times.

In one embodiment, the threshold number is calculated according to the maximum number of bad sectors supplied by the memory manufacturer.

The detector then detects if the number of bad sectors becomes abnormal by exceeding a limit. However, in the case where an attack only damages a part of the sectors, no excess will be detected as the threshold number is not exceeded. Also, the discovery of the attack can be delayed.

In an alternative embodiment of the invention, the integrated circuit also includes means for evaluating the usage of the non-volatile memory, and the detector discovers when a threshold number of bad sectors has been exceeded by comparison with the evaluated usage.

Such a variant takes into account the average degradation of the memory and allows it to be compared to the observed degradation. When the observed degradation is abnormal, for example when it is greater than the average degradation, it can be concluded that an attack has taken place according to the principles of the invention.

In one embodiment of this variant, the degradation register makes it possible to keep a record of the number of bad sectors, and the detector discovers when a threshold number of bad sectors has been exceeded, which is differentiating and defined for a predetermined amount of uses.

The amount of uses can be such that successive uses are checked or such that the inspection is carried out after a predefined number of uses, for example ten uses. Amount of uses is used because, as can be seen below, it can refer to a number of uses or a weighted number of uses.

When the means of scanning the memory are implemented according to the invention, the scanning of the memory is advantageously triggered after a period of a predefined amount of uses.

The integrated circuit advantageously includes a so-called usage register incremented after every time the non-volatile memory is read from or writing to.

The incrementation of the usage register can be weighted in relation to the type of use, for example reading or writing.

Indeed, the degradation processes can be different according to the memory technology. In particular, memories using Flash technology degrade by reading and writing while other types of non-volatile memory only degrade by writing. These two types of usage, reading and writing, do not therefore generate the same degradation statistics.

The detector is advantageously capable of discovering when a threshold number of bad sectors has been exceeded in a geometric portion of the non-volatile memory.

In this case, the threshold number of bad sectors is defined with regard to the size of the geometric portion of the non-volatile memory and the invention works by capitalising on the geometric proximity of the bad sectors. A small number of errors are then detected which would not be significant on a new memory but which, when correlated with the geometric proximity, allow the discovery of a "laser shot" attack. It is noted here that there exist several embodiments which work on the same principle. In particular it is possible to consider evaluating the proximity between bad sectors in order to discover when a threshold number of bad sectors has been exceeded for a given proximity, which then intrinsically defines a geometric portion of the memory. In practice, information on the geometric proximity of bad sectors is extracted, for example, from the data of a memory-management program.

According to one implementation, the detector triggers a modification in a so-called control register intended to be read by the microprocessor with a view to triggering actions.

It is known to use such a register, read periodically or when it receives power, to trigger actions which can particularly be counter-measures. Such a register includes for example several bits, each corresponding to a detector to which the register is linked and from which it receives orders to set the corresponding bit to 1 when the detector detects an anomaly.

In another embodiment of the invention, the detector triggers actions in the microprocessor.

The invention also relates to a technique for detecting attacks on a non-volatile memory accessible by sectors in an integrated circuit with a microprocessor. This technique comprises the steps of determining the number of bad sectors in the memory, comparing the number of bad sectors with a threshold number, discovering when a threshold number of bad sectors has been exceeded in said non-volatile memory, which signals an attack.

Such a method can be implemented in hardware and/or software. Therefore, the various steps of the method can be determined by the instructions of computer programs. A detector according to the invention can therefore be implemented entirely or partially as software. Such a detector is even less expensive.

Therefore, the invention also relates to a computer program on a data medium, this program being capable of being implemented in an integrated circuit, this program including instructions adapted to the implementation of the steps of the method.

This program can be written in any programming language, and be in the form of source code, machine code, or an intermediate code between source code and machine code, such as in a partially compiled form, or in any other desired form.

BRIEF DESCRIPTION OF FIGURES

Further characteristics and advantages of this invention will emerge from the following description, made in reference to the appended drawings which depict an embodiment thereof in a strictly non-limiting manner. In the figures.

DETAILED DESCRIPTION OF AN EMBODIMENT OF THE INVENTION

Figure 1:
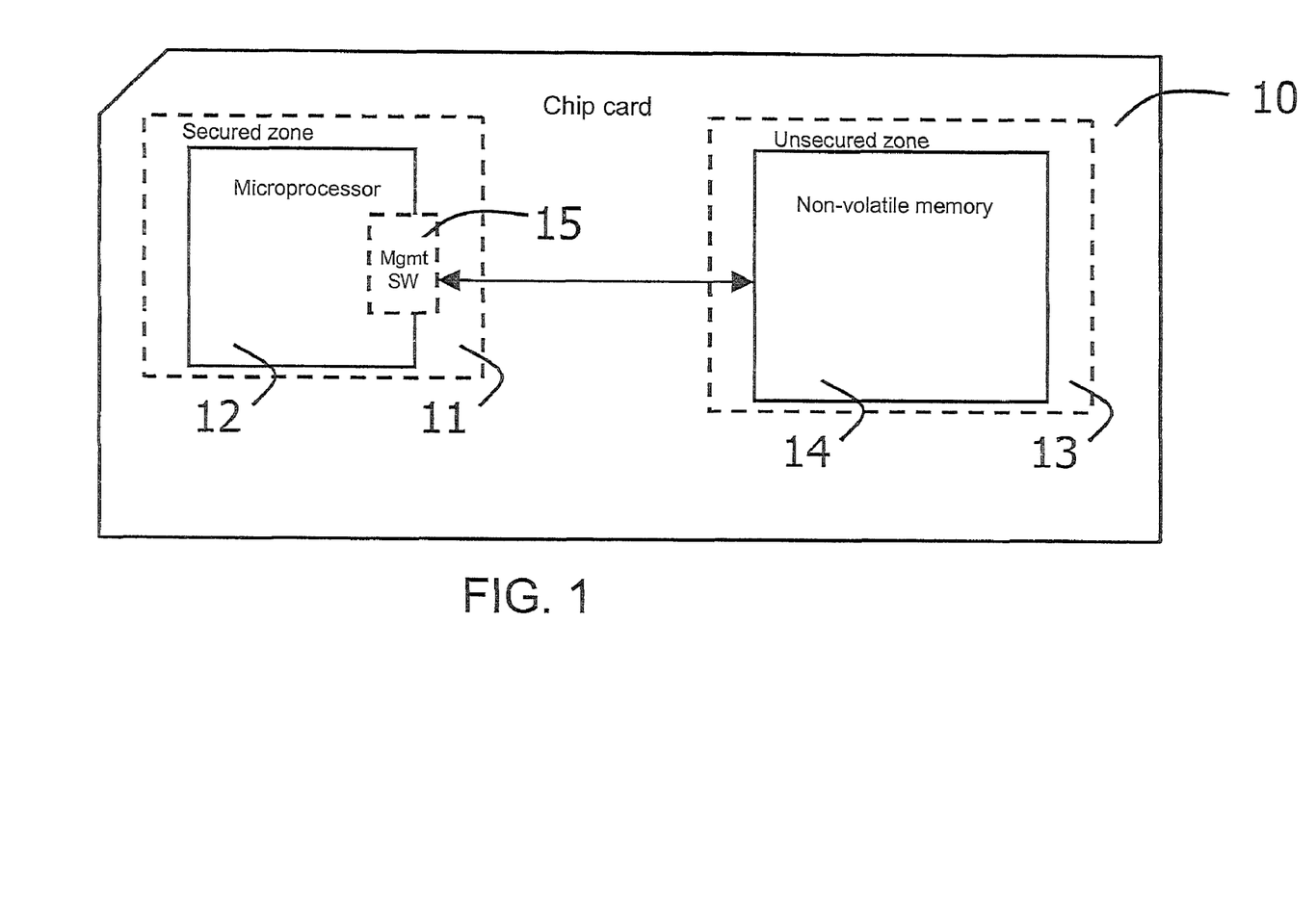
FIG. 1 is a schematic of a chip card in which the invention has been advantageously implemented.

FIG. 1 schematically shows a chip card 10 equipped with an integrated circuit comprising a secured zone 11, wherein a microprocessor 12 is integrated, and a non-volatile memory 14, generally implemented in an unsecured zone 13.

Although the illustration in FIG. 1 shows the non-volatile memory 14 outside a secured zone 11, it has been seen that the invention can also be embodied by a memory implemented in a secured zone 11. Indeed, the invention will allow, for example, the detection of attacks not detected by security devices integrated in the secured zone 11 or to perform a double detection using different security devices.

Non-volatile memory 14 management is traditionally carried out with the help of a management program 15. This management program 15 can be implemented within the secured zone 11, as shown, or outside this zone 11.

In the case where the non-volatile memory 14 is a Flash memory, the management software 15 (FTL, an acronym standing for Flash Translation Layer) traditionally translates the microprocessor's instructions into a Flash-compatible format.

Generally speaking, the secured zone 11 is protected in particular by security detectors capable of detecting abnormal operating or environmental conditions. This can involve frequency detectors monitoring the frequency of the circuit clock, voltage detectors which detect an anomaly in the supply voltage, a light detector which detects if the case of the integrated circuit is open, temperature detectors, passivation detectors, etc.

Such detectors are not, however, commonly implemented in non-volatile memories 14 intended to be supplementary. It follows that these non-volatile memories 14 are not secured by traditional detectors.

Figure 2:
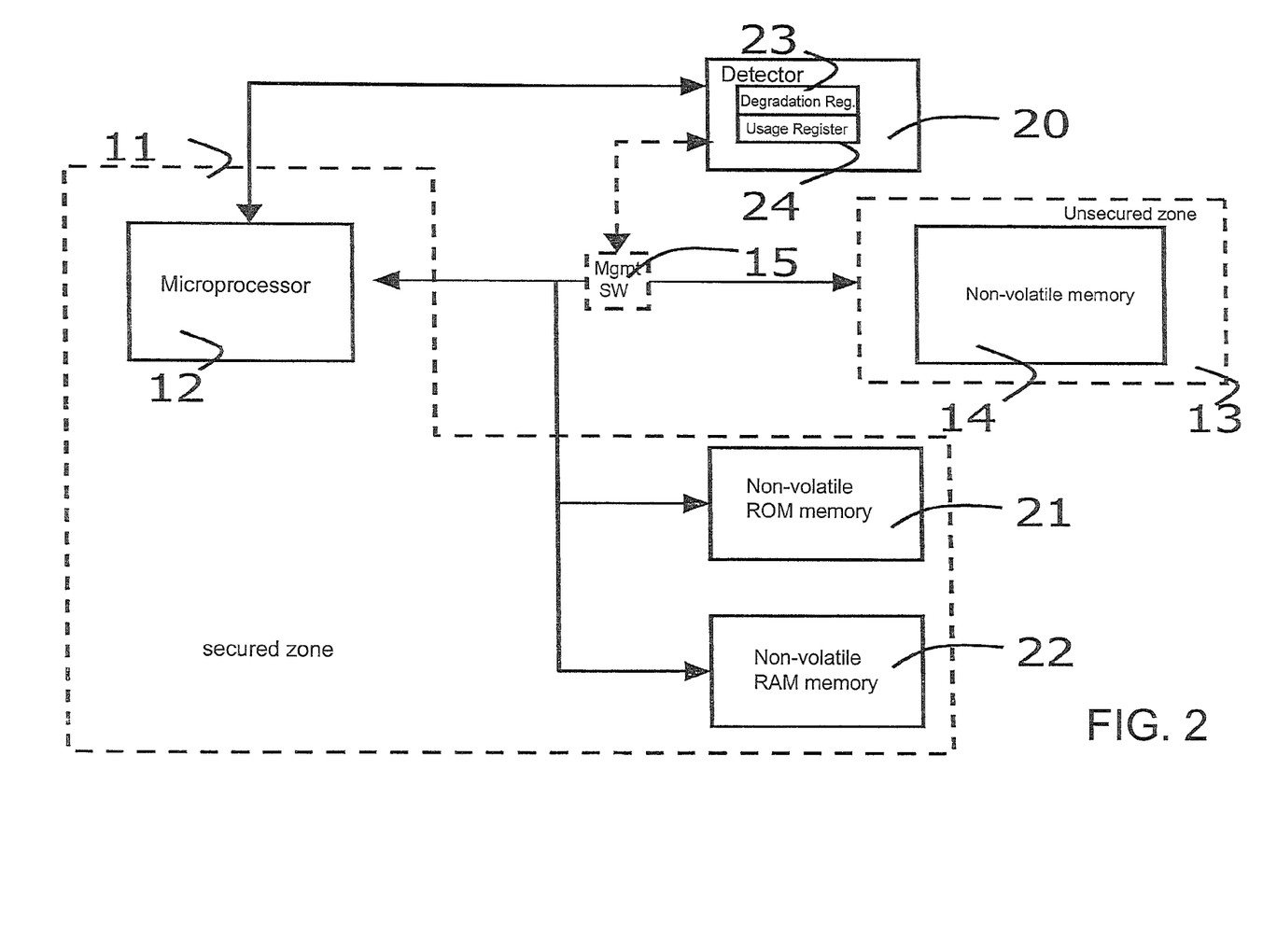
FIG. 2 is a schematic of a first embodiment of an integrated circuit according to the invention.

FIG. 2 describes an integrated circuit according to the invention. This integrated circuit comprises a secured zone 11 and a non-volatile memory 14 outside this secured zone.

The secured zone 11 comprises, in addition to a microprocessor 12, a non-volatile ROM memory 21 and a non-volatile RAM memory 22.

According to the invention, a detector 20 capable of discovering when a threshold number of bad sectors has been exceeded in the non-volatile memory 14 is integrated in the circuit. The detector 20 is preferably integrated in the secured zone 11, for example in an internal memory of the microprocessor 12 which controls the memory 14 management program 15. As shown in FIG. 2, it can also be integrated outside the secured zone 11, for example in the memory 14 management software 15.

The operation of such a detector can, for example, be triggered by when the circuit receives power or upon every read or write request, or even upon every memory sector deletion request.

According to a first embodiment depicted in FIG. 2, the management program 15, here shown outside the secured zone 11, includes means of detecting bad sectors in the non-volatile memory 14 and the detector 20 is linked to this management program 15 in order to discover the number of bad sectors in the memory 14.

The Flash memory management software comprises, for example, means of detecting, by means of a routine triggered by every read or write request, the integrity of the sectors designated by the management program for storing the written data or for reading the data. In the case where the operation of a sector is defective, the sector in question is placed on a list of bad sectors and/or deleted from the list of accessible sectors.

It is possible according to the invention to use such means of detection, which are otherwise known, to trigger an increase in the so-called degradation index 23 every time a bad sector is detected.

It should be noted that it is also possible to use the memory management software 15 to find the geometric location of bad sectors. This localisation is useful when the detector is capable of discovering when a threshold number of bad sectors has been exceeded taking into account the proximity of bad sectors.

Figure 3:
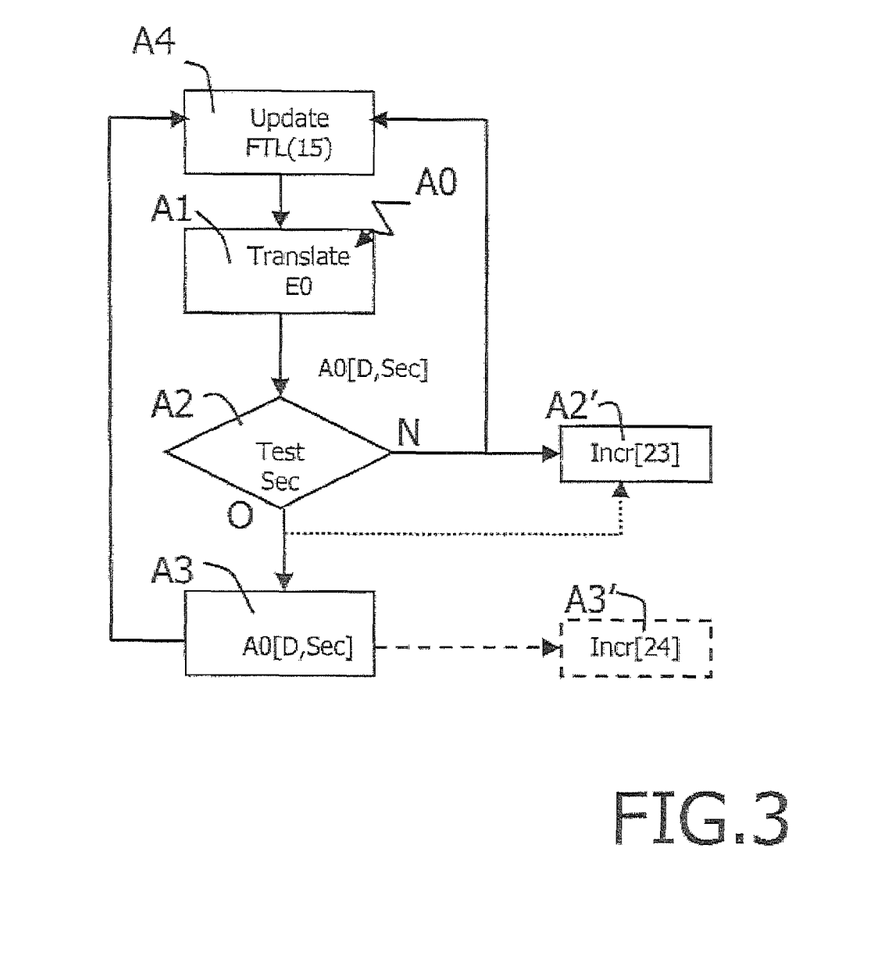
FIG. 3 is a flowchart depicting the operation of the means of detecting bad sectors in a non-volatile memory according to the invention.

FIG. 3 describes the operation of the means of detecting bad sectors in a non-volatile memory according to the invention in combination with a degradation register 23 within the framework of the embodiment shown in FIG. 2.

During the first step, the management software 15 receives an instruction A0. This instruction A0 is, for example, to read or write data D in the memory 14. During step A1, the management program 15 translates this instruction into a format compatible A0[D,Sec] with the memory 14 format for reading or writing data D in a sector Sec.

Step A2 in which a sector inspection is carried out is then performed. If the sector is found to be operational (Case O), the read or write instruction A0[D, Sec] is carried out in step A3.

If the sector is found to be defective (case N), the information is sent to the management program for an update step A4. This update step can consist of modifying the virtual image of the memory stored in the management program, for example, the FTL. In this case, the bad sector is put on a blacklist and will not be used again for storage address allocation by the FTL in step A1.

Parallel to the detection of a bad sector being communicated to the management program, the degradation register 23 is incremented in step A2'.

The commands for this increment advantageously follow, in the control routine performed before every read and write process, those that correspond to the communication of the detection of a bad sector in step A2.

The degradation register 23 can be physically implemented in the memory 14 management program 15, for example, in the FTL. It can then involve a register 23 of the type used for tests and in which the number of bad sectors of the non-volatile memory is listed when it is shipped, the difference being that its contents can be modified and accessed.

The degradation register 23 can also, as shown, be implemented in a particular entity defined by the detector 20.

It is also possible to provide for a number of degradation registers 23 being implemented in several areas of the integrated circuit, ensuring the redundancy of the data serving the detector 20.

The integrated circuit also advantageously comprises means for evaluating the usage of the non-volatile memory 14.

It can involve implementing a degradation register 23 capable, in addition to registering an increment in the number of bad sectors when such a sector is detected in step A2, of keeping a record of the number of bad sectors for at least two uses corresponding to step A3. This implementation is represented by a dotted line on FIG. 3. This dotted line illustrates the registration of the number of bad sectors even when none of these sectors were detected during the usage of the memory 14.

The detector 20, when extracting information from the register 23, will observe a difference between two numbers of bad sectors. This difference will then be compared to a threshold number.

It is then possible, by recording the number of bad sectors for two or more successive uses, to detect when the number of bad sectors increases with each use of the memory. In particular, this shows when the memory is becoming damaged. It is advantageous here to set a low threshold number.

The usage evaluation can also be implemented, as illustrated in dotted lines in FIG. 3, by triggering the incrementation of a so-called usage register 24 upon every read or write operation. The commands corresponding to such an increment advantageously follow those corresponding to the detection of the correct operation of a sector in step A2 (case O) of the control routine.

These commands can also follow a read or write request, for example, during the A1 step, regardless of the control routine.

It is also possible to weight the increment of the register 24 according to the nature of the instruction, for example read or write. Indeed, in certain types of memory, writing operation can degrade the memory more than the reading. Therefore, insofar as the value registered in the usage register 24 will be used according to the invention to quantify an average degradation compared with an abnormal degradation, it is therefore advisable to take into account this difference in degradation when incrementing the usage register 24.

In a similar manner to that presented for the degradation register 23, such a usage register 24 can be physically implemented in various parts of the integrated circuit, in particular at the level of the FTP 15 or at the level of an entity that defines the detector 20.

In the case of implementing register 24 that makes it possible to count the usages, it is possible to trigger the operation of the detector 20 periodically with regard to a number of uses. It is possible to consider, for example, as is sometimes the case withdrawal authorisations of credit cards, only to launch an inspection of the memory every ten uses, every ten uses for writing, or even every one hundred uses for reading. The trigger frequency can be adjusted according to the size of the memory, the desired application and the available resources.

By using such a usage register 24, it is also possible easily only to trigger a registration of the number of bad sectors every ten write operations, for example, and therefore to perform a differentiating check every ten uses. This implementation makes it possible not to conserve an absolute value of the number of bad sectors and, for example, to reset the degradation register to zero after every ten uses. The implementation is thereby made lighter.

In addition, the performance of a differentiating check makes it possible to discover, according to the principles of the invention, a possible reduction of the number of bad sectors, which signals abnormal behaviour, for example due to the presence of a Trojan program, and therefore to trigger actions.

From the above it can be seen that, in the framework of the invention, that the structure and operation of the degradation register 23 can vary, as can the trigger policy of the detector 20.

Figure 4:
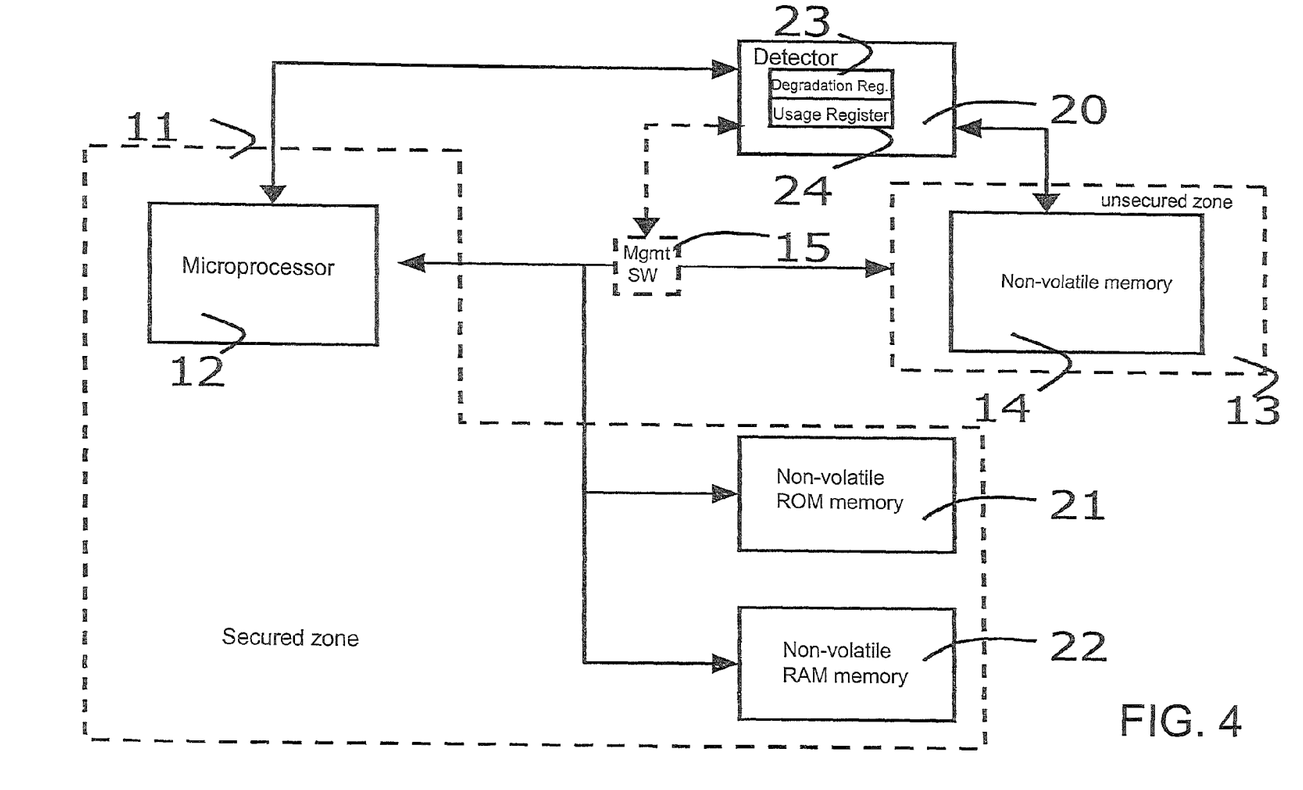
FIG. 4 is a schematic of a second embodiment of an integrated circuit according to the invention.

A further embodiment of the invention can consist of regularly or selectively triggering a scan of the non-volatile memory 14. One example of an embodiment is schematically depicted in FIG. 4 where the entity defining the detector 20 is directly linked to the memory 14 in order to scan the memory 14 searching for bad sectors. In order to perform this scan, it is possible to use a simple integrity check, for example such as ECC, which stands for Error Code Correction, of the data present in a sector, the incrementation of the degradation register being triggered when the data are not complete.

The scan can be exhaustive or performed in accordance with a sampling process, randomly or foreseeably verifying a sample of the memory sectors 14 with each scan performed.

The trigger frequency and the frequency with which the scan is performed can vary in accordance with the resources of the integrated circuit, the frequency of its supply, etc.

In particular, such a scan can be performed periodically in time when the integrated circuit is provided with time management. It is possible to consider such an implementation, for example, in the integrated circuit of a SIM card, where the power supply is continuous and where data processing resources and time slots are regularly available.

It is also possible to consider performing a scan every time a write or read request of the memory 14 is received. Such an implementation, which is heavy in terms of processing resources, can relate to specific applications.

By using a usage register 24, it is also possible to trigger a scan after a certain number of uses, for example, after every hundred uses.

The advantage of this implementation is in accurately knowing, after the scan, the bad sectors at the time of performing the scan. This is not necessarily the case when a memory 14 management program 15 is used, which generally only updates a bad sector Sec when the relevant sector Sec is requested for writing or reading and is detected to be bad at that moment. Unrequested bad sectors can therefore remain unnoticed.

However, it is not easy to perform such a scan on the integrated circuit of a credit card, where the power supply periods are rare and short. In this case, it is preferred to use the management software 15.

For implementations of the invention in integrated circuits with a level of use that is halfway between the two preceding examples, it is possible for the detector 20 to trigger a scan of the memory 14 every time the integrated circuit receives power.

Figure 5:
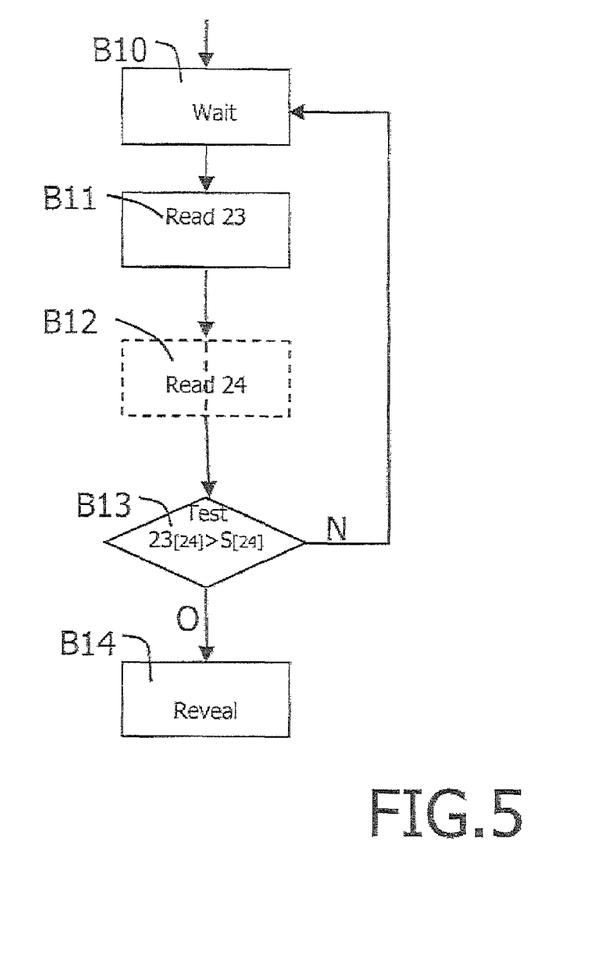
FIG. 5 is a flowchart depicting the operation of a detector according to the invention.

FIG. 5 depicts the operation of the detector 20, which has the function of discovering when the threshold number of bad sectors has been exceeded.

The detector 20 at least comprises means for reading the degradation register 23 in a step B11 and means for comparing the value of the register 23 with a threshold number S in a step B13.

The triggering of these reading means B11 and comparing means B13 corresponds to the triggering of the detector 20, and it has been seen previously that it can be performed periodically when the integrated circuit is provided with time management, when the integrated circuit receives power, in the context of a start-up or checking routine, etc. In general terms, the operation of the detector 20 according to the invention can be triggered by any invention known by those skilled in the trade to trigger the operation of a detector.

It is understood that it is the same for the degradation register 23 to be implemented in the management software 15 or in an entity defining the detector 20 from the time it becomes accessible for reading by the detector 20, which comprises the comparison means B13.

It has been seen that the degradation register 23 can be designed such as to be capable of keeping a record of the number of bad sectors over several uses. In this case, the comparing means B13 will be able to compare the numbers of bad sectors in two uses that are simultaneous or separated by a given number of uses, or even to compare the change over, for example, ten consecutive uses. In the event of an attack, it is indeed possible for this difference in the number of bad sectors from one use to the next to remain regular or increase.

The use of a usage register 24 is illustrated in dotted lines in FIG. 5. It consists of reading the register 24 to discover data regarding the use that corresponds to the value read in the degradation register 23. Then, the comparing means compare the value of the degradation register $23_{[24]}$ according to the value of the register 24 at a threshold $S_{[24]}$ and to the value of the register 24.

When the value of the register 23 is lower than the threshold S (case N), the detector is placed in standby B10.

When the value of the register 23 is higher than the threshold S (case O), the detector 20 discovers that the threshold has been exceeded. This discovery B14 can consist of signalling this event directly to the microprocessor 12 which then triggers actions, in particular countermeasures.

When the operation is indirect, for example when the operation of the detector 20 is triggered when the integrated circuit receives power regardless of the programs run by the microprocessor 12, this discovery can consist of incrementing a control register.

Figure 6:
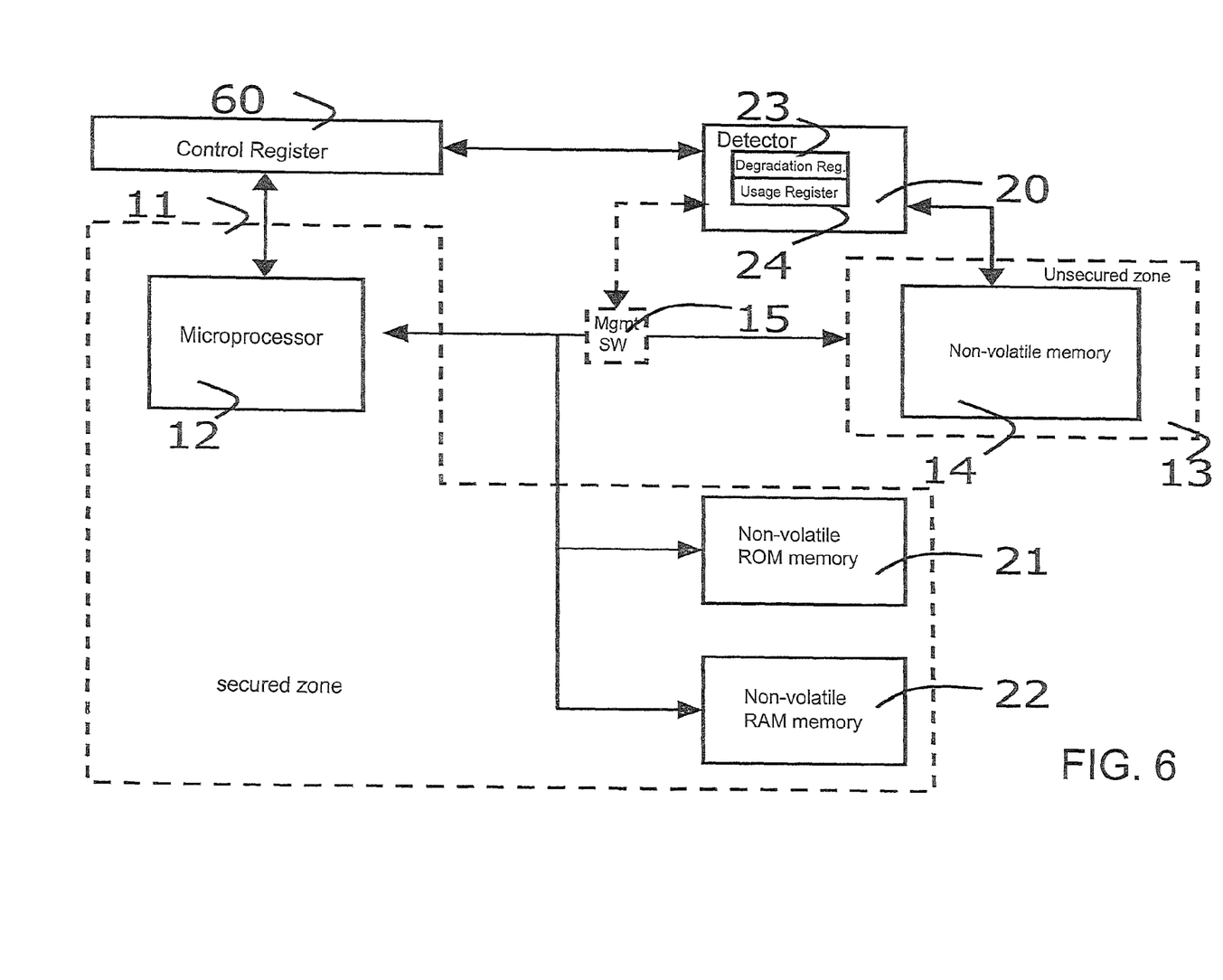
FIG. 6 is a schematic of an alternative embodiment of an integrated circuit according to the invention.

FIG. 6 describes an integrated circuit in which a control register 60 is implemented. This control register 60 is linked at least to the detector 20, but more generally to a plurality of detectors, each of which is capable of modifying the value of one bit. This control register 60 is read by the microprocessor 12 regularly or during specific events. The read frequency of this control register 60 and its triggering can vary and are not directly included in the scope of the invention.

In addition to the illustrative embodiments of the invention shown, it is mentioned ultimately that various embodiments are possible according to the principles of the invention, defined in the following claims.

The invention claimed is:

1. An integrated circuit including at least one microprocessor linked to at least one non-volatile memory having a plurality of sectors and being accessible by sector, comprising:
   means for detecting bad sectors in the at least one non-volatile memory;
   means for evaluating a proximity of the bad sectors between or among one another in a portion of the non-volatile memory; and
   a threshold detector for determining when a threshold number of bad sectors has been exceeded in the non-volatile memory in accordance with the evaluated proximity.

2. An integrated circuit according to claim 1, wherein the integrated circuit includes a degradation register which is incremented every time the detection means detect a bad sector.

3. The integrated circuit according to claim 2, wherein the means of detecting use a software program to manage the non-volatile memory.

4. The integrated circuit according to claim 2, wherein the means of detecting include means for performing a scan of the non-volatile memory to search for the bad sectors.

5. The integrated circuit according to claim 4, wherein the scan is carried out according to a memory sampling plan.

6. The integrated circuit according to claim 4, wherein the scan is performed periodically or every time a specific event occurs.

7. The integrated circuit according to claim 2, wherein at least the degradation register is implemented on a memory other than the non-volatile memory which is under a control of the threshold detector.

8. The integrated circuit according to claim 2, wherein an integrity check is performed at least on the degradation register.

9. The integrated circuit according to claim 2, wherein the integrated circuit includes means for evaluating usage of the non-volatile memory, and the threshold detector discovers when the threshold number of bad sectors has been exceeded by comparison with the evaluated usage.

10. The integrated circuit according to claim 4, wherein the integrated circuit includes means for evaluating usage of the non-volatile memory, and the threshold detector discovers when the threshold number of bad sectors has been exceeded by comparison with the evaluated usage.

11. The integrated circuit according to claim 10, wherein the scan of the memory is triggered after a predetermined amount of uses.

12. The integrated circuit according to claim 1, wherein operations to discover when the threshold number is exceeded are performed a plurality of times.

13. The integrated circuit according to claim 1, wherein the threshold number is calculated from a maximum number of bad sectors supplied by a memory manufacturer.

14. The integrated circuit according to claim 1, wherein the integrated circuit includes means for evaluating usage of the non-volatile memory, and the threshold detector discovers when the threshold number of bad sectors has been exceeded by comparison with the evaluated usage.

15. The integrated circuit according to claim 14, wherein a degradation register is configured to keep a record of the number of bad sectors and the threshold detector discovers when the threshold number of bad sectors has been exceeded, the threshold number of bad sectors being set based on different types of evaluated usage of the non-volatile memory.

16. The integrated circuit according to claim 14, wherein a usage register is incremented every time the non-volatile memory is used for writing or reading.

17. The integrated circuit according to claim 16, wherein an incrementation of the usage register is weighted according to a type of evaluated usage.

18. The integrated circuit according to claim 1, wherein the threshold detector is capable of discovering when the threshold number of bad sectors has been exceeded in a geometric portion of the non-volatile memory.

19. The integrated circuit according to claim 1, wherein the threshold detector triggers a modification in a control register intended to be read by the at least one microprocessor during a specific event.

20. The integrated circuit according to claim 1, wherein the threshold detector triggers actions in the at least one microprocessor.

21. A method of determining whether an attack has occurred on a non-volatile memory having a plurality of sectors and accessible by sector in an integrated circuit with a microprocessor, the method comprising the steps of:
  detecting bad sectors in the non-volatile memory;
  evaluating a proximity of the bad sectors between or among one another;
  determining a threshold number of bad sectors in accordance with the evaluated proximity;
  determining a number of bad sectors in a portion of the non-volatile memory;
  comparing the number of bad sectors with the threshold number of bad sectors, as a comparison result; and
  determining whether the attack has occurred based on the comparison result.

22. A tangible computer-readable medium encoded with a program comprising instructions for performing the steps of the attack determination method according to claim 21 when said program is run by the integrated circuit.

23. An integrated circuit for use with a non-volatile memory having a plurality of sectors, comprising:
  a microprocessor linked to the non-volatile memory; and
  a detector for:
    (1) detecting and locating bad sectors in the non-volatile memory;
    (2) determining an expected number of bad sectors for a portion of the non-volatile memory based on a size of the portion; and
    (3) comparing a number of the bad sectors located in the portion of the non-volatile memory to the expected number of bad sectors to determine whether a threshold is exceeded.

24. The integrated circuit according to claim 23, wherein the microprocessor determines whether an attack has occurred on the non-volatile memory in response the threshold being exceeded.

* * * * *